(12) United States Patent
Casebolt

(10) Patent No.: US 6,232,958 B1
(45) Date of Patent: May 15, 2001

(54) INPUT DEVICE WITH MULTIPLEXED SWITCHES

(75) Inventor: Mark W. Casebolt, Seattle, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 09/222,632

(22) Filed: Dec. 29, 1998

(51) Int. Cl.$^7$ .................................................. G09G 5/00
(52) U.S. Cl. .................... 345/156; 345/157; 345/158; 345/159; 345/161; 345/162; 345/163; 345/164
(58) Field of Search .................................... 345/156, 157, 345/158, 159, 161, 162, 164, 163

(56) References Cited

U.S. PATENT DOCUMENTS

| | | | |
|---|---|---|---|
| 3,943,505 | * | 3/1976 | Berzin et al. ...................... 340/323 |
| 4,673,933 | | 6/1987 | Bauer .............................. 340/825.94 |
| 5,300,927 | * | 4/1994 | Arai et al. ........................... 345/157 |
| 5,541,989 | | 7/1996 | Wu et al. ............................... 379/368 |
| 5,808,085 | | 9/1998 | Hsu et al. ............................... 341/26 |
| 5,905,489 | * | 4/1999 | Takahama et al. .................. 345/174 |

FOREIGN PATENT DOCUMENTS

| | | |
|---|---|---|
| 2283846 | 5/1995 | (GB) . |
| 61-107418 | 5/1986 | (JP) . |
| WO 98/21644 | 5/1998 | (WO) . |

* cited by examiner

Primary Examiner—Richard Hjerpe
Assistant Examiner—Lesperance Jean
(74) Attorney, Agent, or Firm—Theodore M. Magee; Westman, Champlin & Kelly, P.A.

(57) ABSTRACT

An input device for a computer system includes a detection circuit with first and second inputs capable of carrying first and second input signals. A user depressible switch adapted to allow a user to interact with the computer system is placed in series with a rectification device between the two inputs. The rectification device being adapted to limit electrical current in a first direction between the first input and the second input.

26 Claims, 7 Drawing Sheets

INPUT DEVICE WITH MULTIPLEXED SWITCHES

BACKGROUND OF THE INVENTION

The present invention relates to input devices for computer systems. In particular, the present invention relates to multi-switch input devices.

In computer systems, hand-held input devices such as mice and trackballs, are provided to allow the user to control different functions of the computer system. Most of these input devices include at least one button, which activates a switch inside the input device. The button allows the user to select items on the screen and allows the user to perform drag-and-drop functions.

To detect the closure of a switch, input devices typically include an Application Specific Integrated Circuit (ASIC) that has one input for every switch on the device. When conventional microprocessors are used for this task, an individual I/O port pin is allocated for each switch input. Thus, in a two-button mouse the detection circuit has at least two inputs and for a three-button mouse the detection circuit has at least three inputs.

To take advantage of economies of scale, some detection circuits have been designed to be used in input devices that are of the same general type but that have different numbers of switches. For example, the same detection circuit may be used in a two-button mouse and in a three-button mouse. To achieve this flexibility, these detection circuits must have as many inputs as the maximum number of switches that will be connected to the detection circuit. Thus, if a detection circuit is designed to be used in three-button mice and two-button mice it must have at least three inputs.

To reduce costs, detection circuits typically do not include excess inputs. Thus, if the maximum number of switches that will be connected to the detection circuit is three, the detection circuit typically will not have four inputs. Unfortunately, as the number of buttons on an input device increases, this strategy means that the detection circuit must be redesigned to include additional inputs. This involves costly redesign time and does not take advantage of the economies of scale available with current detection circuits.

SUMMARY OF THE INVENTION

An input device for a computer system includes a detection circuit with first and second inputs capable of carrying first and second input signals. A user depressible switch adapted to allow a user to interact with the computer system is placed in series with a rectification device between the two inputs. The rectification device being adapted to limit electrical current in a first direction between the first input and the second input.

In some embodiments of the present invention, the detection circuit has three inputs with a diode and a switch connected in series between two of the inputs. In other embodiments, there are five diode-and-switch pairs connected between various inputs pair combinations of the three inputs. This allows a five button input device to be realized using a three input detection circuit. In general, under embodiments of the invention, a detection circuit with N inputs supports up to N×(N−1) buttons.

DETAILED DESCRIPTION OF THE PREFERRED EMBODIMENTS

Figure 1:
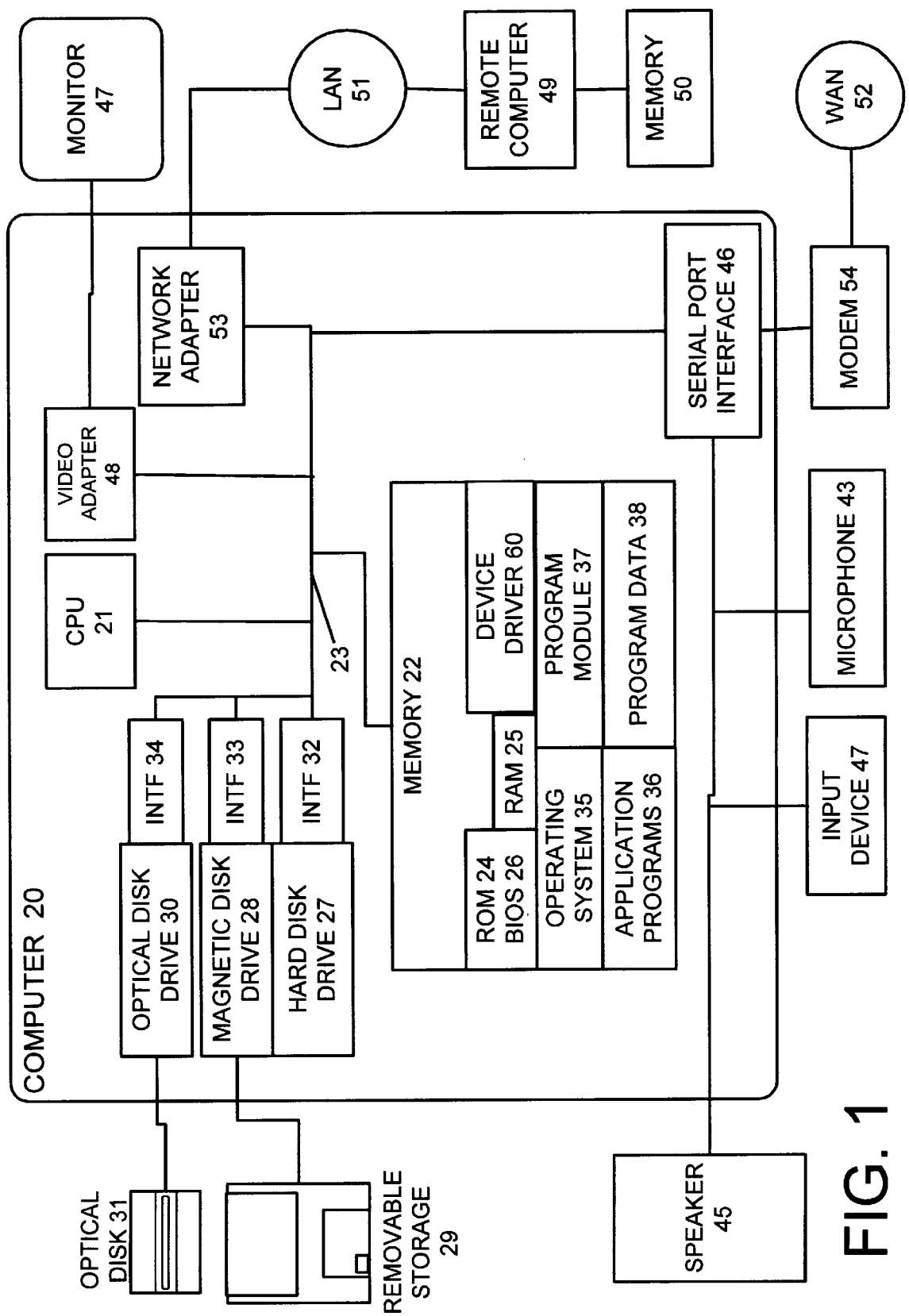
FIG. 1 is a plan view of a computer system providing an environment for the present invention.

FIG. 1 and the related discussion are intended to provide a brief, general description of a suitable computing environment in which the invention may be implemented. Although not required, the invention will be described, at least in part, in the general context of computer-executable instructions, such as program modules, being executed by a personal computer. Generally, program modules include programming interfaces, objects, components, data structures, etc. that perform particular tasks or implement particular abstract data types. Moreover, those skilled in the art will appreciate that the invention may be practiced with other computer system configurations, including hand-held devices, multiprocessor systems, microprocessor-based or programmable consumer electronics, network PCs, minicomputers, mainframe computers, and the like. The invention may also be practiced in distributed computing environments where tasks are performed by remote processing devices that are linked through a communications network. In a distributed computing environment, program modules may be located in both local and remote memory storage devices.

With reference to FIG. 1, an exemplary system for implementing the invention includes a general purpose computing device in the form of a conventional personal computer 20, including a processing unit (CPU) 21, a system memory 22, and a system bus 23 that couples various system components including the system memory 22 to the processing unit 21. The system bus 23 may be any of several types of bus structures including a memory bus or memory controller, a peripheral bus, and a local bus using any of a variety of bus architectures. The system memory 22 includes read only memory (ROM) 24 and random access memory (RAM) 25. A basic input/output (BIOS) 26, containing the basic routine that helps to transfer information between elements within the personal computer 20, such as during start-up, is stored in ROM 24. The personal computer 20 further includes a hard disk drive 27 for reading from and writing to a hard disk (not shown), a magnetic disk drive 28 for reading from or writing to removable magnetic disk 29, and an optical disk drive 30 for reading from or writing to a removable optical disk 31 such as a CD ROM or other optical media. The hard disk drive 27, magnetic disk drive 28, and optical disk drive 30 are connected to the system bus 23 by a hard disk drive interface 32, magnetic disk drive interface 33, and an optical drive interface 34, respectively. The drives and the associated computer-readable media provide nonvolatile storage of computer readable instructions, data structures, program modules and other data for the personal computer 20.

Although the exemplary environment described herein employs the hard disk, the removable magnetic disk 29 and the removable optical disk 31, it should be appreciated by those skilled in the art that other types of computer readable media which can store data that is accessible by a computer, such as magnetic cassettes, flash memory cards, digital video disks, Bernoulli cartridges, random access memories (RAMs), read only memory (ROM), and the like, may also be used in the exemplary operating environment.

A number of program modules may be stored on the hard disk, magnetic disk 29, optical disk 31, ROM 24 or RAM 25, including an operating system 35, one or more application programs 36, one or more device drivers 60, other program modules 37, and program data 38. A user may enter commands and information into the personal computer 20 through input devices such as a keyboard 40, pointing device 42 and a microphone 43. Other input devices (not shown) may include a joystick, game pad, satellite dish, scanner, or the like. These and other input devices are often connected to the processing unit 21 through a serial port interface 46 that is coupled to the system bus 23, but may be connected by other interfaces, such as a sound card, a parallel port, a game port or a universal serial bus (USB). A monitor 47 or other type of display device is also connected to the system bus 23 via an interface, such as a video adapter 48. In addition to the monitor 47, personal computers may typically include other peripheral output devices, such as a speaker 45 and printers (not shown).

The personal computer 20 may operate in a networked environment using logic connections to one or more remote computers, such as a remote computer 49. The remote computer 49 may be another personal computer, a hand-held device, a server, a router, a network PC, a peer device or other network node, and typically includes many or all of the elements described above relative to the personal computer 20, although only a memory storage device 50 has been illustrated in FIG. 1. The logic connections depicted in FIG. 1 include a local area network (LAN) 51 and a wide area network (WAN) 52. Such networking environments are commonplace in offices, enterprise-wide computer network Intranets and the Internet.

When used in a LAN networking environment, the personal computer 20 is connected to the local area network 51 through a network interface or adapter 53. When used in a WAN networking environment, the personal computer 20 typically includes a modem 54 or other means for establishing communications over the wide area network 52, such as the Internet. The modem 54, which may be internal or external, is connected to the system bus 23 via the serial port interface 46. In a network environment, program modules depicted relative to the personal computer 20, or portions thereof, may be stored in the remote memory storage devices. It will be appreciated that the network connections shown are exemplary and other means of establishing a communications link between the computers may be used. For example, a wireless communication link may be established between one or more portions of the network.

Figure 2:
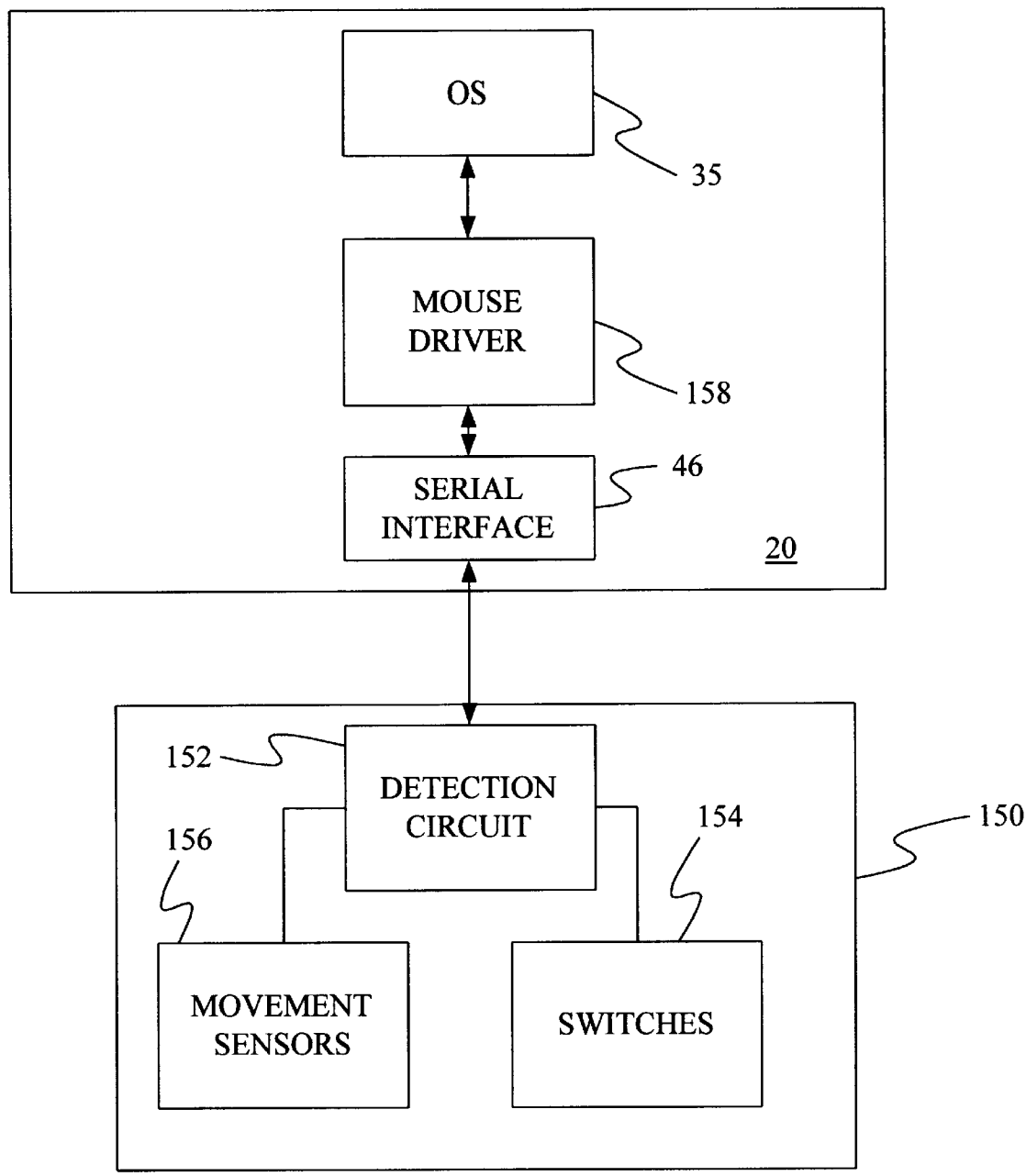
FIG. 2 is a block diagram of a mouse of the present invention and its connection to the computer of FIG. 1.

FIG. 2 is a block diagram of a mouse 150 of one embodiment of the present invention and its connection to computer 20 of FIG. 1. Mouse 150 includes a detection circuit 152 coupled to a plurality of switches 154 and a plurality of movement sensors 156. Movement sensors 156 can include transducers that generate electrical signals based on the movement of a ball that rolls as the mouse is moved across the surface. Movement sensors 156 can alternatively include an optical detection system that generates electrical signals indicative of the movement of the mouse based on images of the surface collected by the optical system. In addition, movement sensors 156 can include a transducer attached to a wheel on the mouse that generates an electrical signal based on the movement of the wheel. Other techniques exist for the detection of physical motion and the invention is not limited to the linear encoders described above.

Switches 154 are typically located beneath a button on the mouse or beneath the wheel of the mouse and provide a low impedance (less than one Ohm) connection between two wires when the button or wheel is physically pressed by the operator. Although single-throw single-pole switches are common, any mechanical structure that provides this function may be used with the present invention. For example, switches 154 may be implemented as rocker arm switches that provide a double-throw, double-pole switch.

Detection circuit 152 detects the closure of switches 154 and receives the signals provided by movement sensors 156. Based on these signals, detection circuit 152 creates a multi-bit mouse packet that indicates the current state of each switch, how far the mouse has moved in both the X and Y directions, and how far the wheel, if present, has been rotated. The detection circuit sends the mouse packet in a serial manner to serial interface 46, which converts the serial data into parallel data before routing the data to mouse driver 158.

Mouse driver 158 interprets the data in the mouse packet to determine if any mouse events, such as switch closures or movement, have occurred. If an event has occurred, mouse driver 158 generates one or more mouse messages that are provided to operating system 35.

Operating system 35 routes the mouse messages to various message hook applications that have been registered with the operating system and eventually routes the mouse messages to the current focus application, which typically is the application associated with the top-most window on the display.

In some embodiments of the invention, mouse driver 158 must know what type of mouse is attached to computer 20 before it can properly interpret the data in the mouse packet. The driver determines this by asking the mouse to identify itself when the computer is started. In some mice, the detection circuit identifies the mouse to the driver by retrieving a value that is hard-wired into the detection circuit. In other mice, the detection circuit tests its inputs to determine how it is configured.

Figure 3:
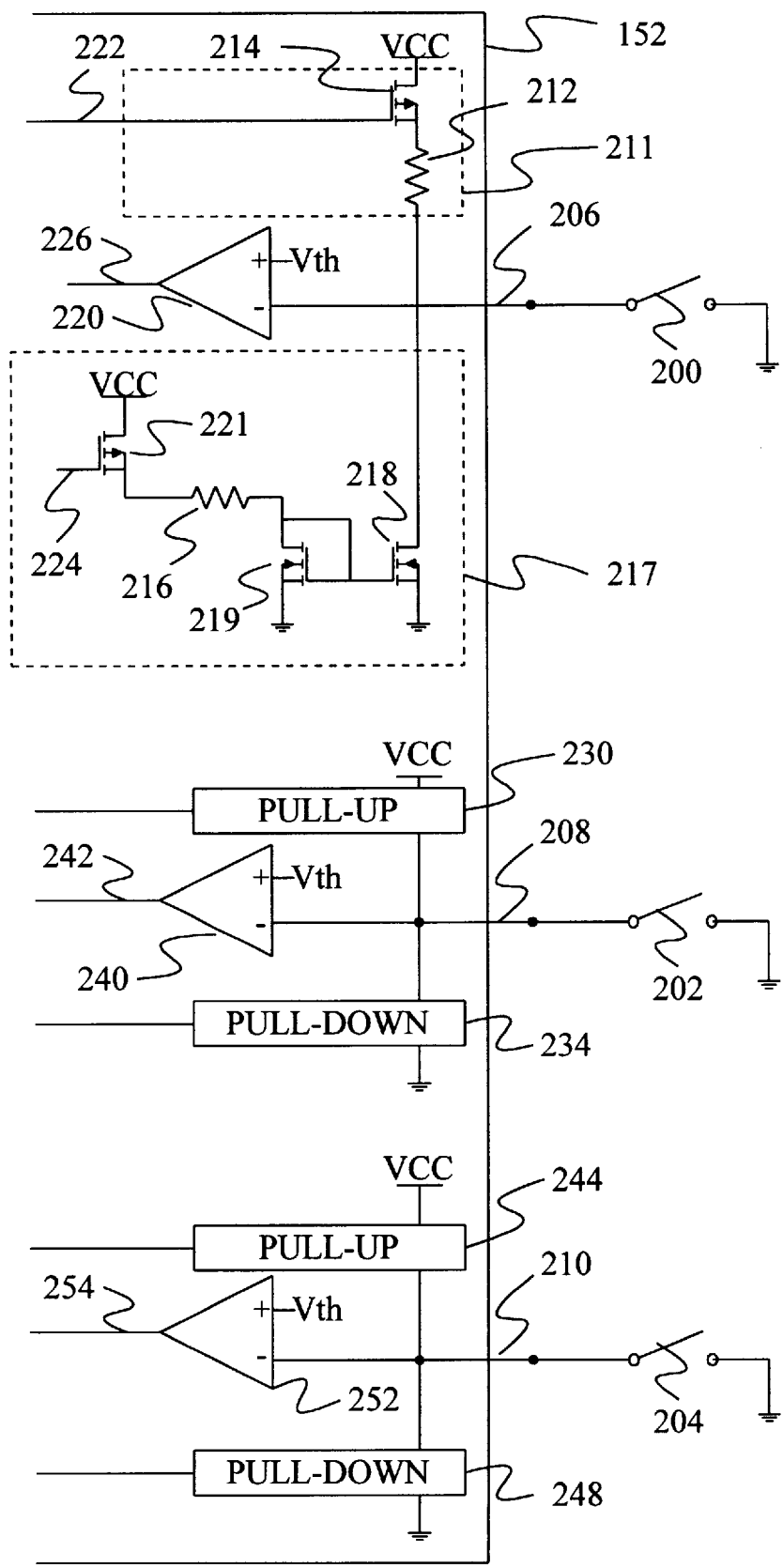
FIG. 3 is a circuit diagram of the switches and an input portion of the detection circuit of FIG. 2 for a three-button hand-held input device.
Figure 4:
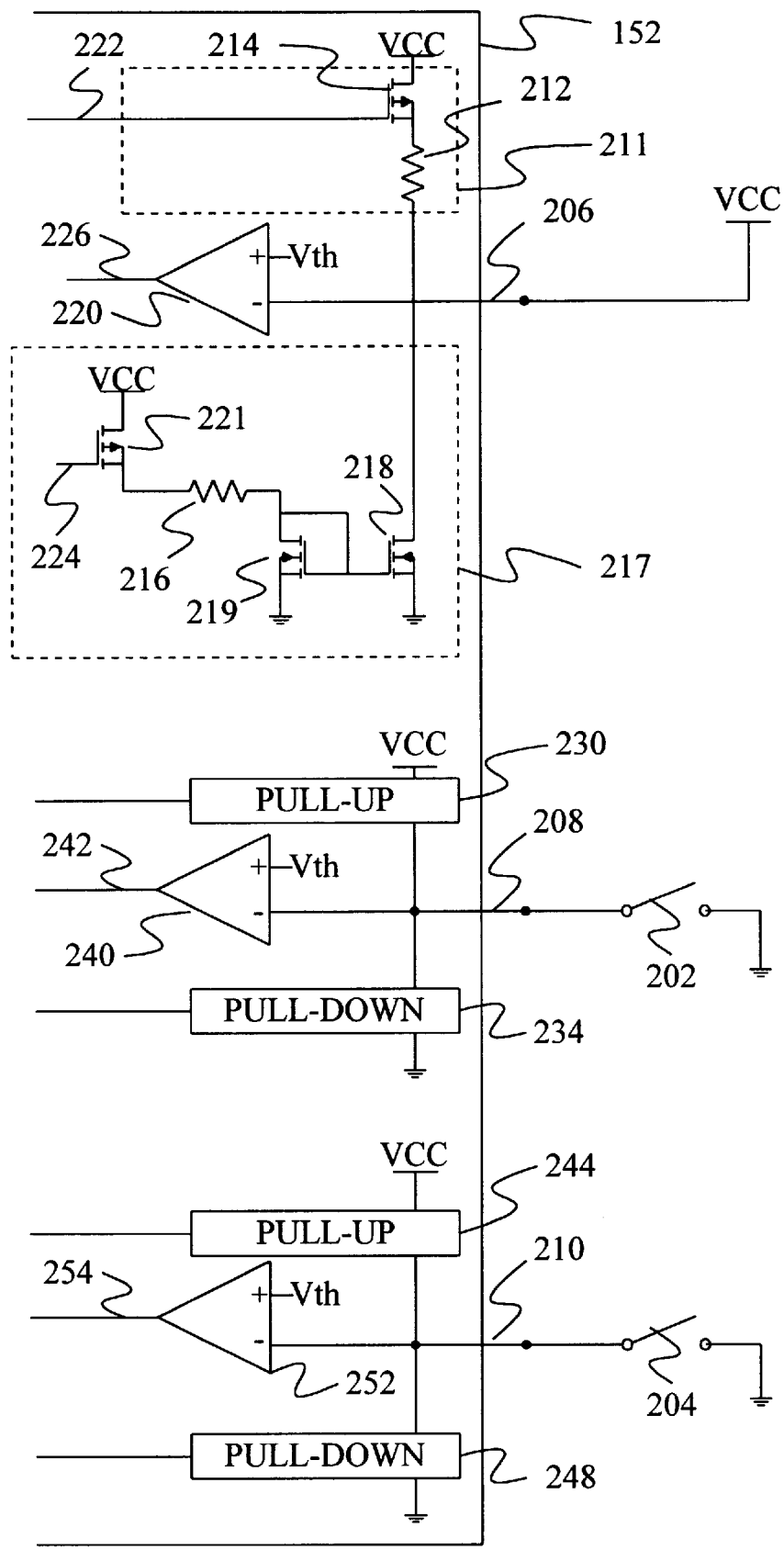
FIG. 4 is a circuit diagram of the switches and an input portion of the detection circuit of FIG. 2 for a two-button hand-held input device.
Figure 5:
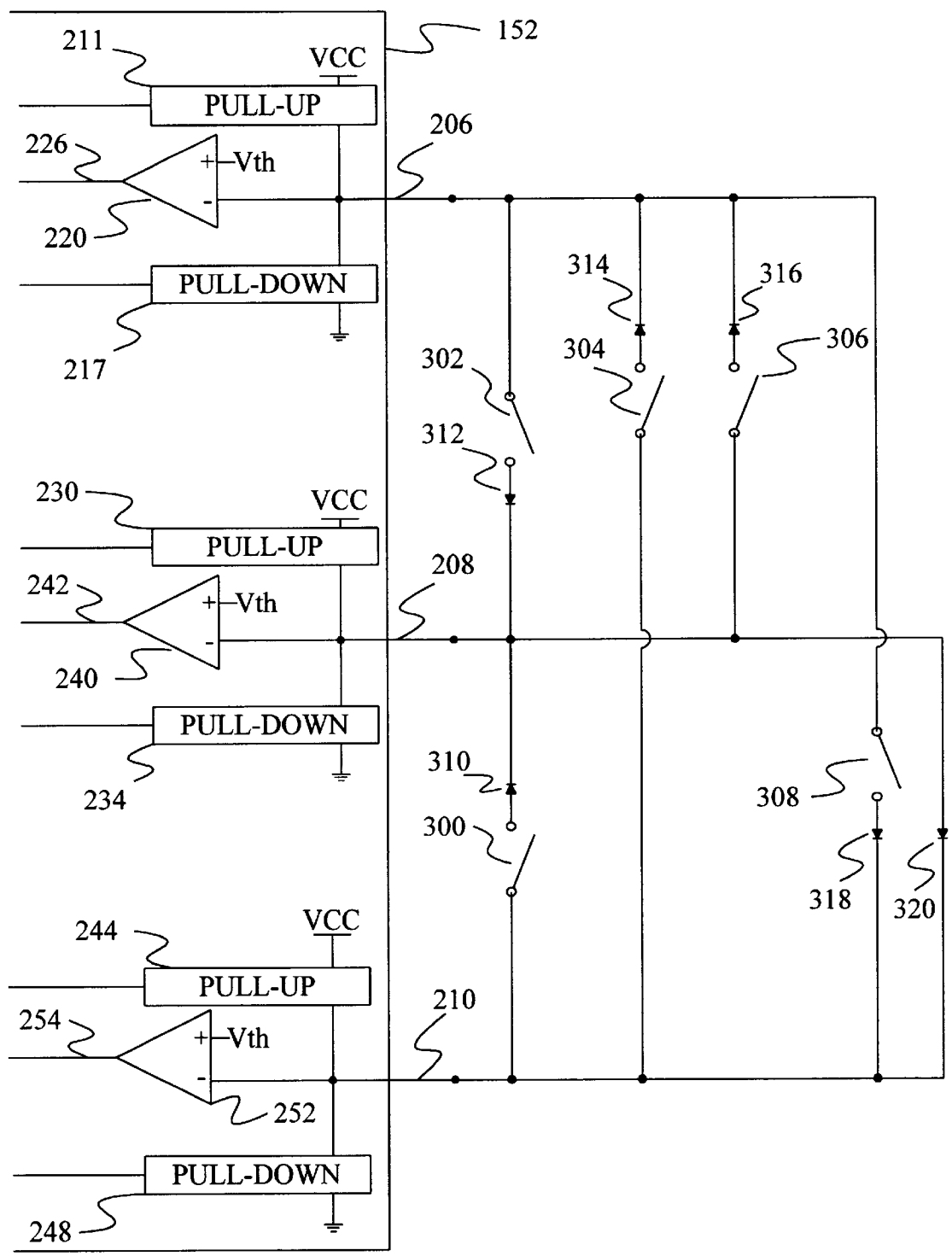
FIG. 5 is a circuit diagram of the switches and an input portion of the detection circuit of FIG. 2 for a five-button hand-held input device of the present invention.

Under the present invention, a single detection circuit, such as detection circuit 152, can have multiple configurations. In particular, the number of switches connected to the detection circuit can vary even though the number of switch inputs on the detection circuit remains constant. In addition, under the present invention, the number of switches connected to the detection circuit can be greater than the number of switch inputs on the detection circuit. Thus, under the present invention, a detection circuit having three switch inputs can support up to six switches. FIGS. 3, 4, and 5 show three configurations for a three input detection circuit of the present invention, which support three switches, two switches, and five switches, respectively.

In the circuit diagram of FIG. 3, three switches 200, 202, and 204 have one terminal each connected to ground and a second terminal connected to a respective input of detection circuit 152. Specifically, switch 200 is connected to input 206, switch 202 is connected to input 208 and switch 204 is connected to input 210. Each input is connected to a pull-up bias circuit, a pull-down bias circuit, and the inverting input of a comparator. For instance, input 206 is connected to a pull-up bias circuit 211 consisting of resistor 212 and transistor 214, and is connected to a pull-down bias circuit 217 consisting of resistor 216 and transistors 218, 219 and 221. Input 206 is also connected to the inverting input of a comparator 220 that has a non-inverting input connected to a voltage source providing a threshold voltage, $V_{TH}$.

Resistor 212 of the pull up bias circuit 211 has one terminal connected to input 206 and another terminal connected to the drain of transistor 214. Transistor 214 is preferably a PMOS transistor that has its gate tied to a control line 222 and its source connected to an upper power supply, VCC. Transistor 214 conducts a current through resistor 212 when the voltage on control line 222 drops below VCC by more than the threshold voltage of transistor 214.

Pull-down bias circuit 217 is a current sink that is formed by PMOS transistor 221, which acts as a switch, and NMOS transistors 219 and 218, which together form a current mirror. To form the current mirror, the gates of transistors 218 and 219 are tied to the drain of transistor 219, while the sources of transistors 218 and 219 are tied to ground. The drain of transistor 219 is also connected to one terminal of resistor 216, which has its other terminal connected to the drain of PMOS transistor 221. The source of transistor 221 is tied to the upper power supply VCC and the gate is connected to a control line 224.

When the voltage on control line 224 drops below VCC by more than the threshold voltage of transistor 221, a current passes through transistor 221 and resistor 216 causing transistors 219 and 218 to conduct currents at their drains. Since the drain of transistor 218 is connected to input 206, this drain current attempts to pull down the voltage at input 206.

In many embodiments, pull-up bias circuit 211 is a weak pull-up bias circuit and pull-down bias circuit 217 is a strong pull-down circuit. This is preferably achieved by implementing resister 212 as a 10 kilohm resistor. In such a configuration, if voltages on control lines 222 and 224 cause transistors 214 and 218 to be active at the same time, the voltage at input line 206 will be pulled down to a voltage that is equal to the saturation voltage of transistor 218. In many embodiments of the present invention that voltage is 0.3 volts.

In other embodiments, weak pull-up circuit 211 is implemented as a current source by using the functional inverse of the current sink described for pull-down bias circuit 217. In such embodiments, the current source is constructed so that the current it provides is an order of magnitude less than the current drawn by pull-down bias circuit 217. The decision to implement the pull-up circuit as a resistive circuit or as a current source is typically based on the process technology used to build the circuit.

To detect the closure of switch 200, control line 222 activates transistor 214 while control line 224 maintains transistor 218 in an off state. If switch 200 is not closed when control line 222 activates transistor 214, the voltage at control line 206 will be at VCC. If switch 200 is closed, the voltage at input 206 will be at ground.

Comparator 220 determines what voltage input-line 206 is at by comparing the voltage to the threshold voltage found at its non-inverting input. If the voltage on input line 206 is below the threshold voltage, comparator output 226 is high indicating that the switch is closed. If the voltage on input line 206 is above the threshold voltage, comparator output 226 is low indicating that the switch is open. In some embodiments, this simple comparison is improved by implementing internal (Schottkey) hysteresis into comparator 220 or by using synchronous sampling for noise immunity.

Input 208 is connected to a weak pull-up bias circuit 230 that is identical to weak pull-up bias circuit 211 and a strong pull-down bias circuit 234 that is identical to strong pull-down bias circuit 217. In addition, input 208 is connected to the inverting input of comparator 240, which has its noninverting input connected to threshold voltage, $V_{TH}$. Comparator 240 produces a comparator output 242 that is indicative of the switch closure of switch 202.

Likewise, input 210 is connected to a weak pull-up bias circuit 244, and a strong pull-down bias circuit 248 that are identical to weak pull-up bias circuit 211 and strong pull-down bias circuit 217, respectively. Input 210 is also connected to the inverting input of a comparator 252, which has its non-inverting input connected to threshold voltage, $V_{TH}$. Comparator 252 produces a comparator output 254 indicative of the closure of switch 204.

FIG. 4 shows a circuit diagram of the input portion of detection circuit 152 for a two-button input device. In FIG. 4, inputs 208 and 210 of detection circuit 152 are connected to switches 280 and 282, respectively, which correspond to the two buttons of the device. Input 206 of detection circuit 152 is not connected to an input switch but instead is connected directly to upper power supply VCC.

When the input device is initially powered up, the detection circuit enters a reset state that clears all of the switch detection circuits and that brings the various clock oscillators of the detection circuit up to speed. After the detection circuit has been reset, it determines the configuration of the input device in which it is placed. In some embodiments, this is done by testing the input lines to the detection circuit. For example, to determine whether detection circuit 152 of FIGS. 3 and 4 is a two-button device or a three-button device, detection circuit 152 tests input line 206 by activating both transistor 214 and transistor 221. This causes transistors 214 and 218 to conduct a current. In a three-button device, the activation of both transistors will cause the voltage at input 206 to be pulled down toward ground. However, in a two-button device, the voltage at input line 206 will remain at VCC because in a two-button input device, input 206 is connected directly to VCC and transistor 218 is unable to lower the power supply. Thus, by activating transistors 214 and 221 and by measuring the voltage at input line 206, a detection circuit 152 of one embodiment of the present invention is able to determine if it is in a two-button device or a three-button device.

FIG. 5 is a circuit diagram of the input portion of detection circuit 152 for a five-switch configuration under one embodiment of the present invention. In prior art hand-held input devices, a five-switch configuration is not possible given a three-input detection circuit. However, under the present invention, although detection circuit 152 has only three inputs 206, 208, and 210, five switches 300, 302, 304, 306, and 308 are implemented. For the discussion below, note that detection circuit 152 is the same in FIGS. 3, 4, and 5 and elements common to FIGS. 3, 4, and 5 are numbered the same. Also note that although the circuit elements of pull-up bias circuit 211 and pull-down bias circuit 217 are not shown directly in FIG. 5, the blocks shown in their place should be understood to represent these elements as they are depicted in FIG. 4.

To implement five switches with only three inputs, the present invention uses a set of diodes, with one diode in series with each switch. In addition, instead of being connected to ground, the switches are connected between the various inputs. For example, one terminal of switch 300 is connected to input 210 while the other terminal of switch 300 is connected to the anode of a diode 310, which has its cathode connected to input 208. Similarly, switch 302 has one terminal connected to input 206 and another terminal connected to an anode of a diode 312, which has its cathode connected to input 208. Switch 304 has one terminal connected to input 210 and another input connected to an anode of a diode 314. The cathode of diode 314 is connected to input line 206 along with the cathode of diode 316. The anode of diode 316 is connected to one terminal of switch 306, which has its other terminal connected to input line 208. Switch 308 has one terminal connected to input line 206 and another terminal connected to the anode of diode 318, which has its cathode connected to input 210.

To identify the closure of one of the switches 300, 302, 304, 306, and 308, the present invention activates the pull-up bias circuits associated with two of the inputs while activating the pull-down bias circuit associated with the third input. Detection circuit 152 then measures the voltage at one of the inputs to determine if a particular switch is closed. For example, to determine if switch 300 is closed, the present invention activates the pull-up bias circuits associated with inputs 210 and 206 and activates the pull-down bias circuit associated with input 208. The pull-down bias circuit associated with input 208 acts as a current sink and lowers the voltage at input 208 by sinking current and the pull-up bias circuit associated with input 210 sources current to input 210. If switch 300 is open, the current sourced to input 210 by the pull-up bias circuit will raise the voltage at input 210 above the threshold voltage, $V_{TH}$. If however, switch 300 is closed, the current sourced by the pull-up bias circuit associated with input 210 will pass through switch 300 and diode 310 and will be drawn into the pull-down bias circuit associated with input 208. This will cause the voltage at input 210 to drop below the threshold voltage. Thus, by measuring the voltage at input 210 while the pull-up bias circuit associated with input 210 is active and while the pull-down bias circuit of input 208 is active, the present invention is able to determine the closure of switch 300.

The threshold voltage used for this comparison is chosen such that two switch closures will not be interpreted as a single switch closure. For instance, the threshold voltage is chosen such that the simultaneous closure of switches 304 and 302 will not be interpreted as the closure of switch 300. Under the present invention, this double switch closure will not be interpreted as the closure of switch 300 because the double switch closure path from input 210 through input 206 and finally to input 208 includes two diodes. Under embodiments of the present invention, the threshold voltage is chosen such that a two diode voltage drop between input 210 and input 208 is considered a high voltage whereas a single diode drop from input 210 to input 208 is considered a low voltage.

In particular, for an embodiment having sufficiently matched diodes that each produce a forward voltage drop of 0.6 volts and having a pull-down transistor with a saturation voltage of 0.3 volts, the threshold voltage is set at 1.2 volts, halfway between the two diode voltage drop of 1.5 volts (0.6+0.6+0.3) and the one diode voltage drop of 0.9 volts (0.6+0.3). Under these embodiments, if switches 302 and 304 are both closed and switch 300 is open, input 210 will be at 1.5 volts, which is above the threshold voltage, and detection circuit 152 will correctly interpret this voltage as indicating that switch 300 is open. However if switch 300 is closed, input 210 will be at 0.9 volts, which is below the threshold voltage, causing the detection circuit to correctly indicate that switch 300 is closed.

To detect the closure of switch 302, the present invention activates the pull-up bias circuits associated with inputs 206 and 210 and activates the pull-down bias circuit associated with input 208. The voltage at input 206 is then measured to determine if the switch 302 is closed in a manner similar to that described above for switch 300. To detect the closures of switches 304 and 306, the present invention activates the pull-up bias circuits associated with inputs 208 and 210 while activating the pull-down bias circuit associated with input 206. To detect the closure of switch 304, the detection circuit measures the voltage and input 210, and to detect the closure of switch 306, the detection circuit measures the voltage at input 208, in a manner similar to that described above for detecting the closure of switch 300. To detect the closure of switch 308, the present invention activates the pull-up bias circuit associated with inputs 206 and 208 while activating the pull-down bias circuit associated with input 210. The voltage at input 206 is then compared against the threshold voltage.

The circuit diagram of FIG. 5 also includes a configuration diode 320, which has its anode connected to input 208 and its cathode connected to input 210. Configuration diode 320 is used by detection circuit 152 to determine the configuration of the input device if the configuration is not otherwise stored or hard-wired into the device. In particular, an input device of the embodiment of the present invention shown in FIG. 5 can determine if it is a three-button input device or a five-button input device. This is accomplished by activating the pull-up bias circuit associated with input 208 while activating the pull-down bias circuit associated with input 210. If the voltage at input 208 does not drop during this condition, the input device is a three-button device.

If the voltage at input 208 is low under these conditions, the pull-down bias circuit associated with input 210 is deactivated and the pull-up bias circuit associated with input 210 is activated. If this action causes the voltage at input 208 to increase, the input device is a five-button device. Note that configuration diode 320 can be removed from the circuit of FIG. 5 without changing the operations of the switches shown in FIG. 5. In addition, a switch can be added in series with diode 320 between input 208 and input 210 to construct a six-button input device. However, under either of these conditions, the input device will not be able to determine its configuration directly by the switch input configuration until the user closes one of the switches. This problem may be alleviated by using other stimuli to indicate the six-button configuration. For example, an external jumper setting or a multi-purpose input to a micro-controller may be used within the input device to indicate the configuration. In addition, the host computer connected to the input device can set the configuration of the input device.

Figure 6:
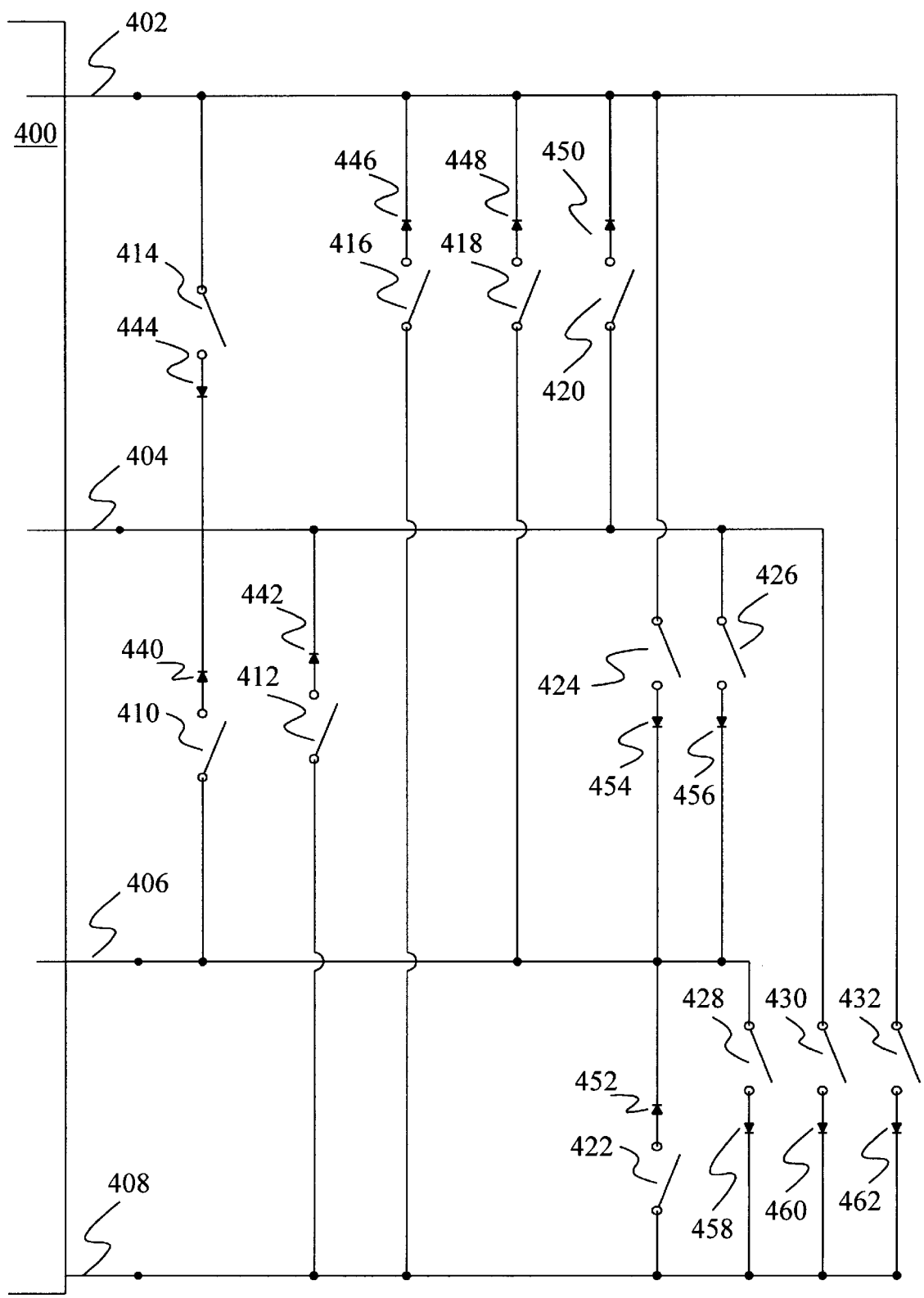
FIG. 6 is a circuit diagram of the switches and an input portion of the detection circuit of FIG. 2 for a twelve-button hand-held input device of the present invention.

FIG. 6 is a circuit diagram for a twelve-button input device showing a portion of a detection circuit 400 having four inputs 402, 404, 406, and 408. Each input has an associated pull-up bias circuit (not shown for simplicity) and a pull-down bias circuit (not shown for simplicity) that are identical to the pull-up and pull-down bias circuits described above for FIGS. 3, 4, and 5. In addition, each input is connected to a respective inverting input of a respective comparator (not shown) that has its non-inverting input connected to a threshold voltage. Each of the switches 410, 412, 414, 416, 418, 420, 422, 424, 426, 428, 430, and 432 are connected in series with a respective diode 440, 442, 444, 446, 448, 450, 452, 454, 456, 458, 460, and 462 between two respective inputs. As in FIG. 5, to determine whether any particular switch is closed, the detection circuit activates the pull-down bias circuit associated with the input tied to the cathode of the switch's associated diode. Thus, to determine whether switch 410 is closed, the detection circuit activates the pull-down bias circuit associated with input 404, which is connected to the cathode of diode 440 associated with switch 410. At the same time that the pull-down bias circuit is activated for this input, the pull-up bias circuits associated with all other inputs are activated. The voltage at the input line connected to the switch of interest is then measured to determine whether the switch is closed. Thus, to determine whether switch 410 is closed, the voltage at input 408 is measured since input 408 is connected to switch 410. If the voltage of the measured input is above the threshold voltage, the switch is open and if the voltage is below the threshold voltage the switch is closed.

Comparing FIGS. 5 and 6, it can be seen that the present invention can be used to implement more than twelve buttons on an input device by using a detection circuit with more input pins. In general, an N input detection circuit under the present invention can support up to N×(N−1) switches.

In the discussion above, the operation of the detection circuits of the present invention has been described with reference to weak pull-up bias circuits and strong pull-down bias circuits. Under alternative embodiments of the invention, strong pull-up bias circuits are used with weak pull-down bias circuits. In such embodiments, to determine the closure of switches that extend along paths between inputs, the detection circuit activates the strong pull-up bias circuit connected to the switch while activating the weak pull-down bias circuits associated with the other inputs. The voltage at the input connected to the switch's diode is then measured. If the voltage is high, the switch is closed and if the voltage is low, the switch is open.

Figure 7:
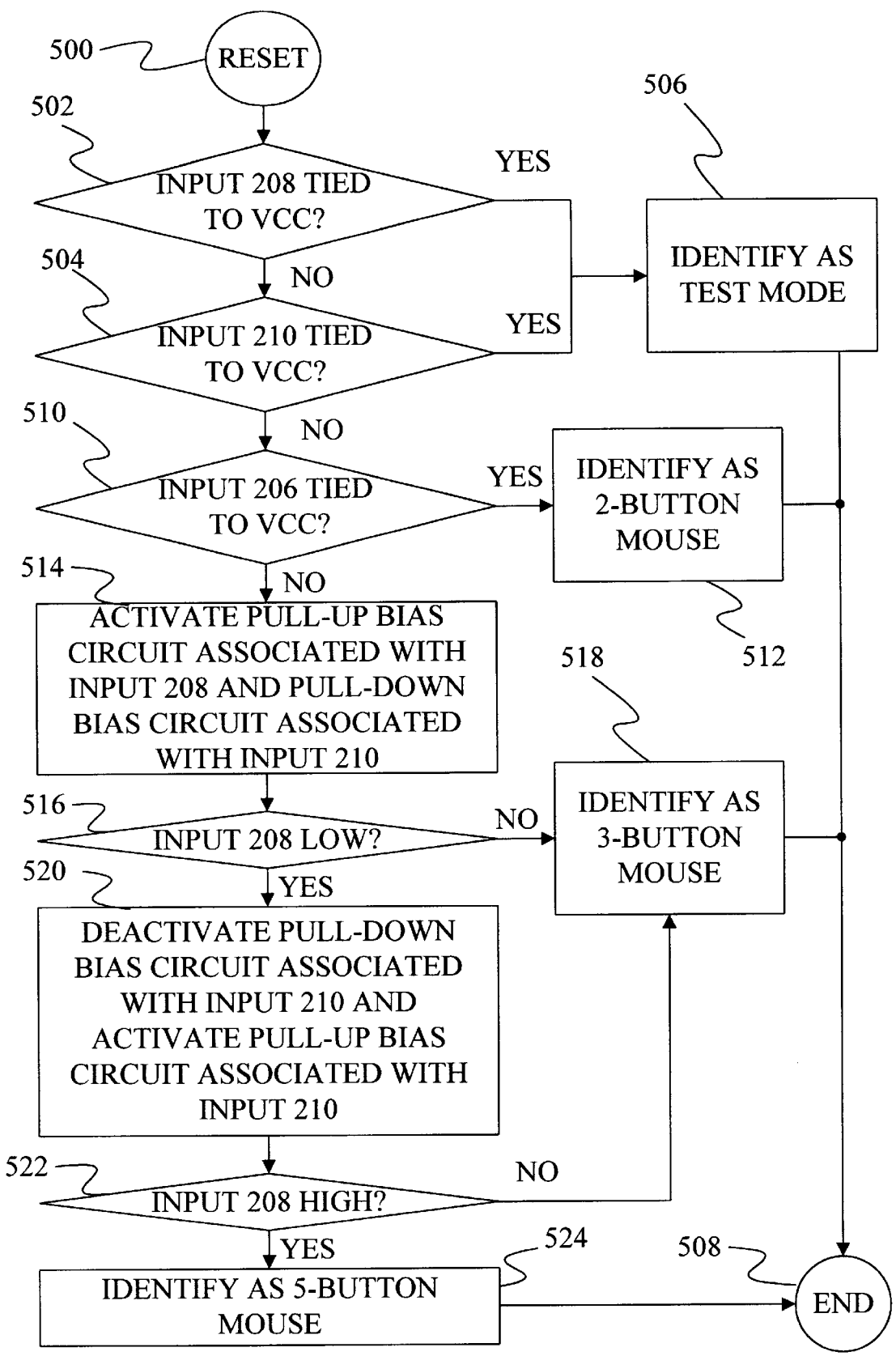
FIG. 7 is a flow diagram for determining the configuration of an input device under the present invention.

FIG. 7 is a method under the present invention for an input device to determine whether it is configured as a two-button, a three-button, or a five-button device. In FIG. 7, the inputs associated with detection circuit 152 described in FIGS. 3, 4, and 5 are used as a reference.

The method begins at step 500 where detection circuit 152 is reset. After detection circuit 152 has been reset, detection circuit 152 determines if input 208 is tied to VCC at step 502 by activating the pull-up bias circuit and the pull-down bias circuit associated with input 208 and comparing the voltage at input 208 to a threshold voltage. If the voltage at input 208 remains high, input 208 is tied to VCC. If input 208 is tied to VCC at step 502, the device is considered to be in test mode and control continues at step 506.

If input 208 is not tied to VCC, detection circuit 152 determines if input 210 is tied to VCC at step 504 using the same technique as applied to input 208. If input 210 is tied to VCC, the device is considered to be in test mode and control continues at step 506, where the device is identified as being in test mode. After step 506, the process ends at step 508.

If neither input 208 or input 210 is tied to VCC at steps 502 and 504, control continues at step 510 where detection circuit 152 determines it input 206 is tied to VCC using the techniques described above for input 208. If input 206 is tied to VCC, the device is identified as a two-button device in step 512 and the process ends at step 508.

If input 206 is not tied to VCC at step 510, the process continues at step 514 where the pull-up bias circuit associated with input 208 is activated and the pull-down bias circuit associated with input 210 is activated. At step 516, the voltage at input 208 is compared to the threshold voltage, and if the voltage input is high, the input device is identified as a three-button device in step 518 and the process ends at step 508.

If the voltage at input 208 is low at step 516, the pull-down bias circuit associated with input 210 is deactivated and the pull-up biasing circuit associated with input 210 is activated. This occurs in step 520. At step 522, the voltage at input 208 is again compared to the threshold voltage and if the voltage at input 208 is low, the device is identified as a three-button device at step 518 and the process ends at step 508. If at step 522 the voltage at input 208 is high, the device is identified as a five-button device in step 524 and the process ends at step 508.

As an alternative to the method of FIG. 7, the configuration of the input device can be set without testing the input lines of the detection circuit by using software instructions or by using hardware connections that are separate from the detection circuit. In such embodiments, the input device is configured to act as if it were connected to a desired number of input switches. Thus, an input device under the present invention having a detection circuit with three input lines can be configured to act as a one, two, three, four, five, or six-button device regardless of the number of buttons actually found on the device. For an input device with four inputs on its detection circuit, the input device can be configured to act as a device with as few as one button or as many as twelve buttons.

Although the present invention has been described with some reference to mice, the invention has application to other hand-held input devices such as trackballs that have detection circuits with a limited number of inputs. Using the present invention, the detection circuits are made portable to input devices that are of the same general type but that have different numbers of switches.

Although the present invention has been described with reference to preferred embodiments, workers skilled in the art will recognize that changes may be made in form and detail without departing from the spirit and scope of the invention.

What is claimed is:

1. An input device for a computer system, the input device comprising:
 a detection circuit designed to detect the state of at least one switch, the detection circuit comprising:
  a first input capable of carrying a first input signal;
  a second input capable of carrying a second input signal;
  a rectification device capable of limiting electrical current flow in a first direction; and
  a switch connected in series with the rectification device between the first input and the second input, the switch capable of opening and closing an electrical path.

2. The input device of claim 1 wherein the rectification device is a diode.

3. The input device of claim 1 further comprising a first bias network coupled to the first input and capable of providing a current to the first input and a second bias network coupled to the second input and capable of sinking a current from the second input.

4. The input device of claim 3 wherein when the first bias network and the second bias network are active, the first input is at a first voltage when the switch is open and the first input is at a second voltage when the switch is closed.

5. The input device of claim 4 further comprising:
 a second switch; and
 a second rectification device in series with the second switch between the first and second inputs and capable of limiting current flow in a second direction between the first and second inputs, the second direction opposite the first direction.

6. The input device of claim 5 further comprising a third bias network coupled to the second input and capable of providing a current to the second input when active and a fourth bias network coupled to the first input and capable of sinking current from the first.

7. The input device of claim 6 wherein when the third bias network and the fourth bias network are active, the second input is at the first voltage when the second switch is open and is at the second voltage when the second switch is closed.

8. The input device of claim 7 further comprising:
a third input capable of carrying a third input signal;
a third switch and third rectification device connected in series between the first input and the third input, the third rectification device capable of limiting current flow from the first input to the third input;
a fourth switch and fourth rectification device connected in series between the first input and the third input, the fourth rectification device capable of limiting current flow from the third input to the first input; and
a fifth switch and fifth rectification device connected in series between the second input and the third input, the fifth rectification device capable of limiting current flow from the second input to the third input.

9. The input device of claim 8 further comprising a rectification device coupled between the second input and the third input that is capable of preventing current flow from the third input to the second input.

10. The input device of claim 9 wherein the input device is capable of determining at least part of its configuration by biasing the second input at a first test potential and the third input at a second test potential, the first test potential greater than the second test potential.

11. The input device of claim 1 further comprising N inputs inclusive of the first and second inputs, the input device configurable to detect N(N−1) switches coupled to the N inputs.

12. The input device of claim 11 wherein the input device is capable of determining at least part of its configuration based on a hardware connection separate from the inputs.

13. The input device of claim 11 wherein the input device is capable of determining at least part of its configuration based on a software instruction from a host computer coupled to the input device.

14. The input device of claim 13 wherein the input device is capable of determining a different configuration each time it is provided power after being without power.

15. A switch detection circuit for an input device for a computer system, the switch detection circuit comprising:
a first input;
a pull-up bias circuit coupled to the first input for providing current to the first input;
a second input;
a pull-down bias circuit coupled to the second input for drawing current from the second input; and
a voltage detection circuit coupled to the first input for detecting voltage at the first input, the voltage indicative of whether a switch in the input device is closed.

16. The detection circuit of claim 15 wherein the pull-down bias circuit is a strong pull-down bias circuit relative to the pull-up bias circuit.

17. The detection circuit of claim 15 wherein the pull-down bias circuit is a weak pull-down bias circuit relative to the pull-up bias circuit.

18. The detection circuit of claim 15 wherein the pull-down bias circuit is a current sink.

19. The detection circuit of claim 15 wherein the pull-up bias circuit is a current source.

20. The detection circuit of claim 15 wherein the pull-up bias circuit comprises a resistor coupled to the first input.

21. The input device of claim 11 wherein the voltage at the first input decreases when the switch is closed while the pull-up bias circuit is active and the pulldown bias circuit is active.

22. The detection circuit of claim 15 further comprising a second pull-down bias circuit coupled to the first input, a second pull-up bias circuit coupled to the second input, and a second voltage detection circuit coupled to the second input for detecting voltage at the second input, the voltage at the second input indicative of whether a second switch in the input device is closed.

23. The detection circuit of claim 22 wherein the voltage at the second input decreases when a switch is closed while the second pull-up bias circuit and the second pull-down bias circuit are both active.

24. A method in an input device having a multiple-input detection circuit for determining the configuration of the input device, the method comprising steps of:
activating a first bias circuit coupled to a first input of the detection circuit, the first bias circuit capable of providing current to the first input;
activating a second bias circuit coupled to a second input of the detection circuit, the second bias circuit capable of sinking current from the second input;
measuring the potential at the first input and determining that the input device is in a first configuration if the electrical potential at the first input is below a threshold electrical potential.

25. The method of claim 24 comprising further steps of:
before determining if the input device is in the first configuration, activating a third bias circuit coupled to the first input while activating the first bias circuit; and
measuring the potential at the first input and determining that the input device is in a second configuration if the electrical potential at the first input is above the threshold electrical potential.

26. The method of claim 25 wherein the first configuration is a five-button configuration and the second configuration is a two-button configuration.

* * * * *